United States Patent
Ming-Jiunn et al.

[11] Patent Number: 5,917,201
[45] Date of Patent: Jun. 29, 1999

[54] LIGHT EMITTING DIODE WITH ASYMMETRICAL ENERGY BAND STRUCTURE

[75] Inventors: Jou Ming-Jiunn; Lee Biing-Jye; Jacob C. Tarn, all of Hsin-Chu, Taiwan

[73] Assignee: Epistar Co., Hsin-Chu, Taiwan

[21] Appl. No.: 08/923,586

[22] Filed: Sep. 4, 1997

[51] Int. Cl.[6] .................................................. H01L 33/00

[52] U.S. Cl. .............................. 257/94; 257/96; 257/98; 257/103

[58] Field of Search .................................. 257/13, 94, 96, 257/98, 101, 103, 99; 372/45, 46

[56] References Cited

U.S. PATENT DOCUMENTS

| 5,481,122 | 1/1996 | Jou et al. | 257/96 |
| 5,744,829 | 4/1998 | Murasato et al. | 257/96 |
| 5,789,768 | 8/1998 | Lee et al. | 257/96 |

*Primary Examiner*—Minh Loan Tran

[57] ABSTRACT

A high bandgap material is used as a cladding layer to confine the carrier overflow in a aluminum-gallium-indium-phosphide light emitting diode. The quantum efficiency is improved. The use of this high bandgap material as a window material also prevents current crowding. The efficiency can further be improved by using a Distributed Bragg Reflector in the structure to reflect light, and a buffer layer to reduce interface dislocation.

15 Claims, 5 Drawing Sheets

LIGHT EMITTING DIODE WITH ASYMMETRICAL ENERGY BAND STRUCTURE

BACKGROUND OF THE INVENTION

The structure of a conventional aluminum-gallium-indium-phosphide (AlGamnP) light-emitting diode is shown in FIG. 1. An n-type gallium-arsenide (GaAs) substrate 11 has a bottom electrode 10. An n-type AlGaInP cladding layer 12 is grown over the substrate and is grown with an undoped AlGaInP active layer 13. A p-type AlGaInP cladding layer 14 is grown over layer 13. Then a p-type gallium-phosphide (Ga-P) layer 15 is grown over layer 14. A p-type electrode 16 is deposited over layer 15.

The energy bandgap of the AlGaInP is proportional to the aluminum mole fraction. When the aluminum mole fraction in the cladding layer is larger than the mole fracion in the active layer 13, the confinement effect of the electrons is better. In the past study of the AMGaInP material, it was assumed that when (AlxGa1−x)0.5In0.5P is lattice-matched to GaAs substrate, the material can be changed from direct bandgap into indirect bandgap with a cross-over point of x=0.7. The relationship between the direct bandgap and the value of x is given by the following formula:

$$Eg(x)=1.91+0.61x(eV) \quad (1)$$

Researchers found that the degree of electron confinement is related to the energy and gap. In general, the conduction band offset ($\Delta Ec$) is proportional to energy band. offset ($\Delta Eg$). in other words, researchers considered that the maximum $\Delta Ec$ occurs when x=0.7, i.e. the confinement effect in the double heterojunction AlGaInP is at its maximum when x=0.7. However, recent researchers found that the cross-over point when the material changes from direct band gap to indirect band gap occurs at a lower value of x=0.7. When this double-beterojunction AlGaInP material is used to obtain short wavelength yellow-green or pure green light emitting diodes, and the light emitting efficiency is low. This observation further made researchers to doubt whether the transition point from direct band to indirect band gap occurs at of value of x lower than x=0.7. Recently, D. I. Mowbvey and A. D. Print found that the transition point from direct bandgap to indirect bandgap of AlGaInP occurs when the aluminum fraction (xAl) lies in the range 0.5~0.53. Therefore, the maximum direct band gap from equation (1) is 2.23 eV instead of 2.34 eV. If $\Delta Ec/\Delta Eg=0.6$, the following table shows the difference in electron confinement effect for different values of x.

| Active layer AL fraction | Cladding layer Al fraction | Electron confinement (meV) |
|---|---|---|
| x = 0.3 (λ ~ 592 nm) | x = 0.7 | 64 |
|  | x = 0.53 | 85 |
| x = 0.45 (λ ~ 568 nm) | x = 0.7 | 9 |
|  | x = 0.53 | 30 |

From the above table, we know that when AlGaInP is used as a cladding layer, the confinement effect is not good, especially for the top p-type confinement layer.

SUMMARY

An object of this invention is to increase the quantum efficiency of LEDs. Another object of this invention is to improve the confinement effect of LEDs to prevent carrier overflow. Still another object of this invention is to provide a high bandgap material as a window material tor the LED.

These objects are achieved in this invention by providing a energy barrier to improve the confinement effect and to prevent the carrier overflow. A high bandgap top p-type cladding layer is used to reduce the carrier overflow, thus improving the quantum efficiency. The high bandgap material can also serve as window material and to prevent current crowding.

DETAILED DESCRIPTION OF THE PREFERRED EMBODIMENTS

Figure 2:
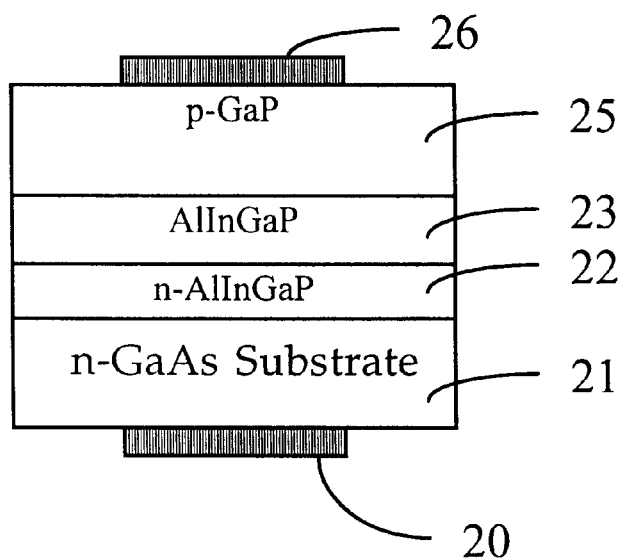
FIG. 2 shows a firstembodiment of the prevent invention.

FIG. 2 shows the first embodiment of the asymmetrical band structure of double-heterojunction of the present invention. An n-type gallium arsenide (GaAs) semiconductor is used as the substrate 21, below which an electrode 20 is placed. Above the substrate 21 is an n-type AlGaInP cladding layer 22, over which is grown an active AlGaInP layer 23. A high bandgap confinement layer lies on top of the layer 23, and has a top electrode 26.

Figure 1:
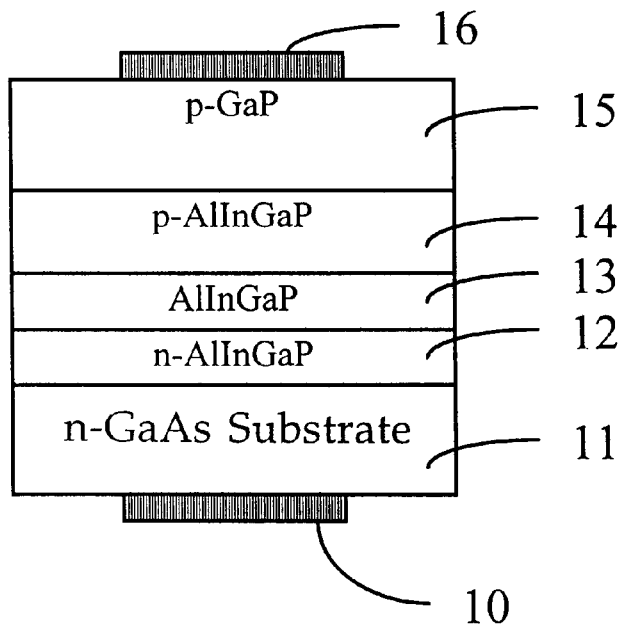
FIG. 1 shows the prior art.

Comparing FIG. 2 with FIG. 1, note that the p-type GaP layer is uses as the cladding layer instead of the traditional AlGaInP layer 14 and the p-type GaP window layer 15. The use of p-GaP layer 25 as a cladding layer has the following advantages:

1. The GaP cladding layer 25 has a higher energy gap. This inventor has proven that the GaP layer 25 has at least a difference in energy gap of 100 meV as compared to AlInGaP layer 14. This invention uses GaP layer 25 as a cladding layer and increases the confinement energy by more than 60 meV. (assuming $\Delta Ec/\Delta Eg=0.6$), and the quantum efficiency of the AlGaInP LED can be greatly increased.

2. The p-type GaP layer 25 has a higher carrier concentration than AlGaInP. Generaily, the carrier concentration of AlGaInP cannot reach $1\times10^{18}$ cm$^{-3}$, but the carrier concentration of the p-type GaP cladding layer 25 can easily reach $3\times10^{18}$ cm$^{-3}$. Theoretically, the higher the carrier concentration, the higher the effective barrier height is and the lower the carrier overflow is.

3. The p-type GaP layer 25 serves also as a window layer. The p-type GaP layer 25 has a resistivity of about 0.05 Ω-cm compared with the AlInGaP resistivity of 0.5 Ω-cm. In addition, the GaP layer 25 does not absorb the light from the active layer. Therefore, the GaP window layer has the advantage of high electrical conductivity and optical transparency.

The top high bandgap cladding layer may use other material than GaP such as: alumin-gallium-phosphide, gallium-indium-phosphide and gallium-arsenide-phosphide.

Figure 3:
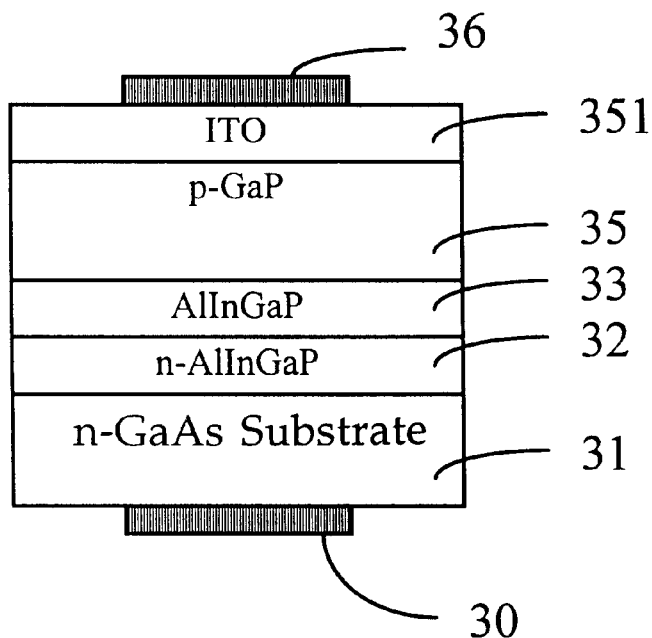
FIG. 3 shows a second embodiment of the present invention.

FIG. 3 shows a second embodiment of the present invention. The bottom layer is a first electrode 30, over which is the n-type GaAs substrate 31. A confinement layer AlGaInP 32 is grown over the substrate 32 and is covered with an active AlGaInP layer 33. A second high conductivity confinement layer 35 lies over the layer 33 and is covered with a transparent, electrically conductive oxide thin film 351. A second electrode 36 contacts the thin film 351, which is usually made of indium-tin-oxide (ITO).

Figure 4:
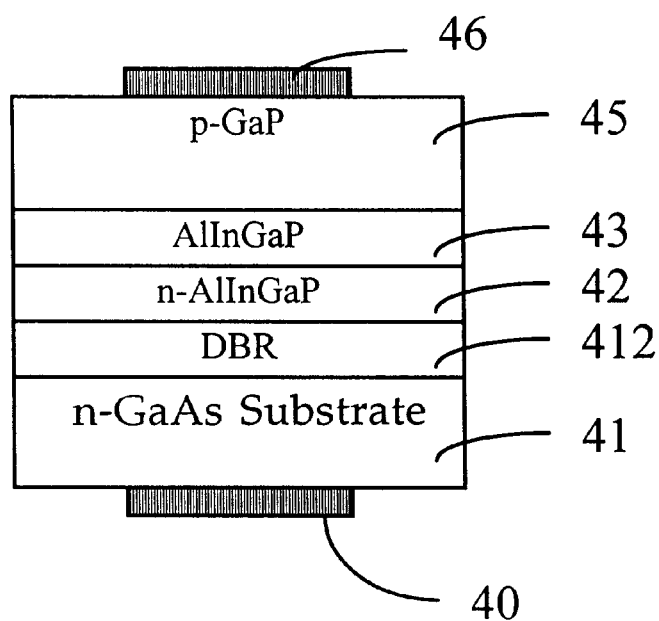
FIG. 4 shows a third embodiment of the present invention.

FIG. 4 shows a third embodiment of the present invention. The bottom layer is a first electrode 40, over which is the n-type GaAs substrate. A Distributed Bragg Reflector (DBR) 412 is grown over the substrate 41. The DBR is used to reflect the downward radiation into upward radiation, thus increasing the intensity of the light. Above the DBR layer 412 is a first AlGaInP cladding layer 42. A second high conductivity cladding layer 45 is grown over the active AlGaInP layer 43 and is topped with a second electrode 46.

The material for the DBR may be selected from a group consisting of AlGaInP, aluminum-gallium-arsenide and gallium-arsenide.

Figure 5:
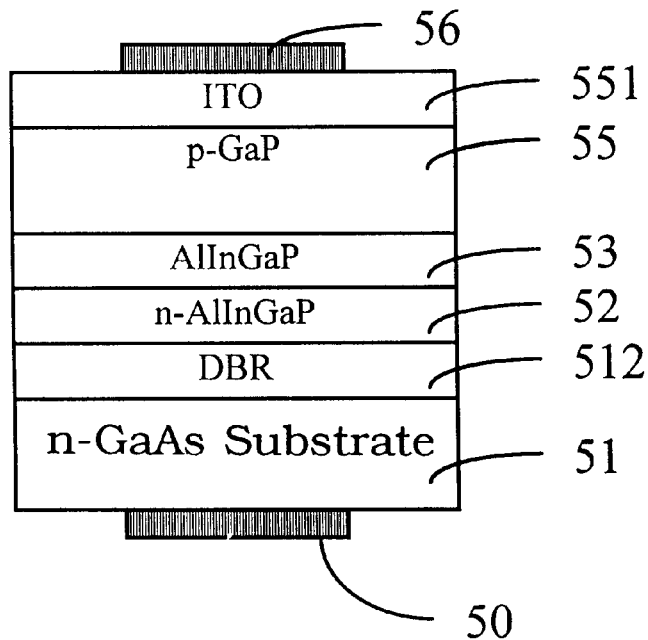
FIG. 5 shows a fourth embodiment of the present invention.

FIG. 5 shows fourth embodiment of the present invention. The structure includes a DBR layer 512 and thin conductive thin film oxide 551.

Due to the lattice mismatch of GaP with GaAs substrate, the lattice constant differs by approximately 3.6%. Therefore, when GaP is directly grown on an active AlGaInP layer, dislocation at the interface may result, causing non-radiative recombination center and reduced quantum efficiency. To improve, a thin layer may be used to lattice match the GaAs substrate before the Gap cladding layer is grown. The bandgap of the thin layer should be larger than that of the active layer. Experiments have proven that the dislocation between GaP and AlGaInP generally propagates upward for few hundred nm, and seldom extends downward. Thus the quality of the active layer and its interface is preserved.

To further improve the dislocation problem, the buffer layer can be grown over the AlGaInP layer before the GaP cladding layer. The composition of the buffer layer can gradually change from AlGaInP to GaP. The buffer layer may be of other material selected from a group consisting of AlGaInP, gallium-indium-phosphide, gallium-arsenide-phosphide, and aluminum-gallium-arsenide.

Figure 6:
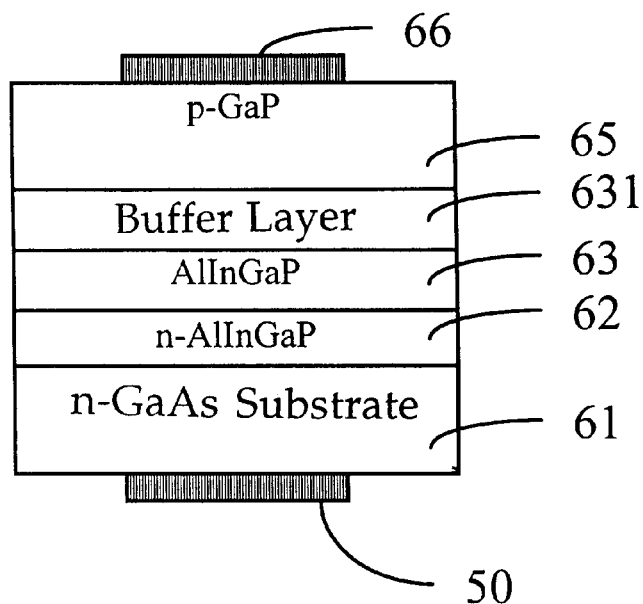
FIG. 6 shows a fifth embodiment of the present invention.

FIG. 6 shows a fifth embodiment of the present invention. The bottom is a first electrode 60, over which is a conductive substrate 61. A first conductive AlGaInP layer 62 is grown over the substrate 61 and the covered with an active AlGaInP layer 63. A buffer layer 631 is deposited on the active layer 63, and gradually change its composition to lattice match with a second high bandgap top cladding layer 65. A second electrode 66 is placed over the top layer 66.

In addition to the high bandgap cladding layer, a lattice matched super lattice or a mnultiple quantum barrier (MQB) may also be introduced. The super-lattice structure can soften the interface defect, and the multiple quantum well can further increase the energy barrier.

All the crystalline layer of this invention can be grown with metal organic vapor deposition, which is simpler and more cost effective than older methods.

Figure 7:
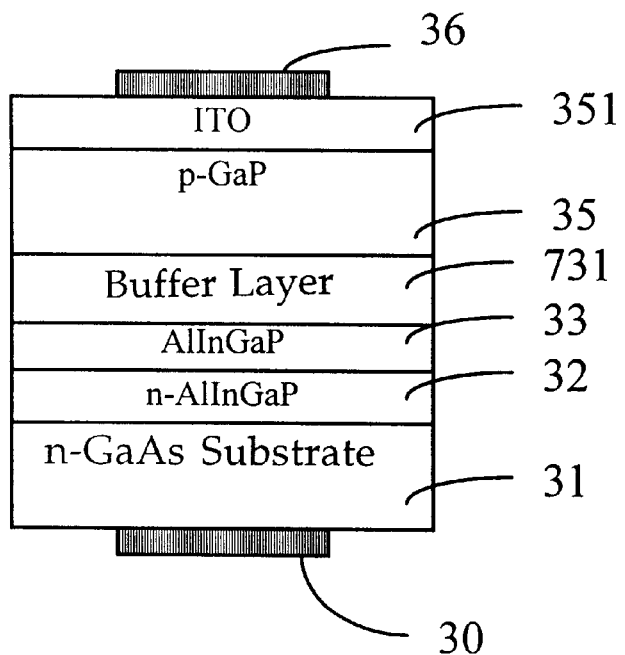
FIG. 7 shows a sixth embodiment of the present invention.

FIG. 7 shows a sixth embodiment of the present invention. In this embodiment, a buffer layer is inserted in the structure shown in FIG. 3. The buffer layer 731 is inserted between the AlGaInP layer 33 and the second conductive high bandgap layer 35.

Figure 8:
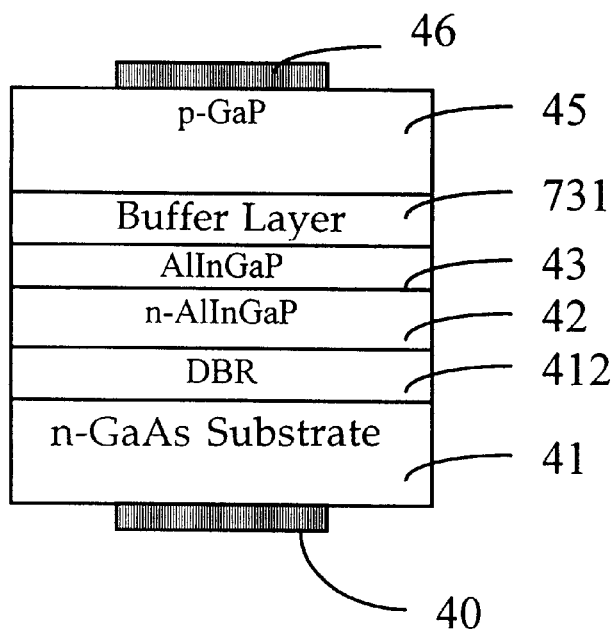
FIG. 8 shows a seventh embodiment of the present invention.

FIG. 8 shows a seventh embodiment of the present invention. A buffer layer is added to the structure in FIG. 4. The buffer layer 731 is inserted between the AlGaInP layer 43 and the second conductive high bandgap layer 45.

Figure 9:
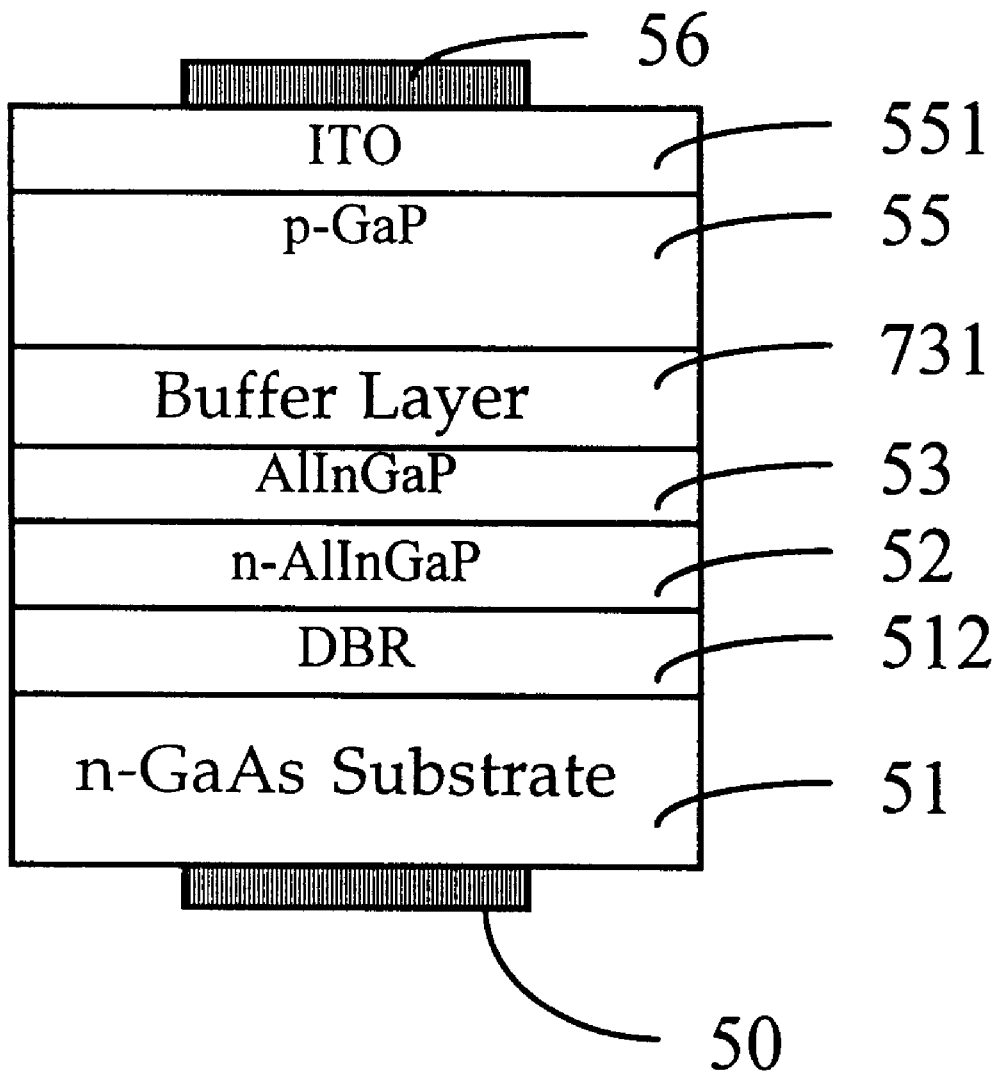
FIG. 9 shows an eighth embodiment of the present invention.

FIG. 9 shows an eighth embodiment of the present invention. A buffer layer is added to the structure shown in FIG. 5. The buffer layer 741 is inserted between the AlGaInP layer 53 and and second conductive high bandgap layer 55.

The foregoing description illustrates the preferred embodiments of the present invention, and is not limited to these examples. Any equivalent techniques to implement the structures are all within the scope of this invention.

What is claimed is:

1. A light emitting diode, comprising:
   a first electrode connected to an external power supply;
   a first conductive gallium arsenide (GaAs) layer connected to said first electrode and serving as a substrate;
   a first conductive aluminum-gallium-indium phosphide (ALGaInP) layer connected on one side to said substrate and serving as a lower cladding layer;
   an active AlGaInP layer connected on one side to second side of said lower cladding layer;
   a second conductive layer with an asymmetrical energy bandgap to said first conductive lower cladding layer, connected on one side to second side of said active AlGaInP layer serving as an upper cladding layer; and
   a second electrode connected on one side to second side of said upper cladding layer and a second side to said external power supply.

2. A light emitting diode as described in claim 1, wherein said upper cladding layer is made of high bandgap material.

3. A light emitting diode as described in claim 2, wherein said high bandgap material is selected from a group consisting of gallium-phosphide (GaP), alumnum-gallium-phosphide (AlGaP), gallium-indium-phosphide (GaInP), and gallium-arsenide-phosphide (GaAsP).

4. A light emitting diode as described in claim 1, wherein said active AlGaInP layer has a multiple quantum well structure.

5. A light emitting diode as described in claim 1, wherein a buffer layer is inserted between said active AlGaInP layer and said upper cladding layer.

6. A light emitting diode, comprising:
   a first electrode connected to an external power;
   a first conductive gallium arsennide (GaAs) layer connected to said first electrode and serving as a substrate;
   a first conductive aluminum-gallium-indium phosphide (AlGaInP) layer connected on one side to said substrate and serving as a lower cladding layer;
   an active AlGaInP layer connected on one side to second side of said lower cladding layer;
   a second conductive layer with asymmetrical energy bandgap to said first conductive lower cladding layer, connected on one side to second side of said active AlGaInP layer, serving as an upper cladding layer;
   a transparent conductive thin oxide film connected on one side to second side of said upper cladding layer; and
   a second electrode connected on one side to second side of said transparent conductive thin oxide film and a second side to said external power supply.

7. A light emitting diode as described in claim 6, wherein said conductive thin oxide film is selected from a group consisting of indium-oxide, tin-oxide, and indium-tin-oxide.

8. A light emitting diode as described in claim 6, wherein a buffer layer is inserted between said active AlGaInP layer and said upper cladding layer.

9. A light emitting diode, comprising:

a first electrode having one side connected to an external power supply;

a first conductive gallium-arsenide layer connected on one side to second side of said first electrode, serving as a substrate;

a distributed Bragg reflector (DBR) layer connected on one side to second side of said substrate, serving as a light reflector;

a first conductive aluminum-gallium-indium-phosphide (AlGaInP) layer connected on one side to second side of said DBR layer, serving as a lower cladding layer;

an active AlGaInP layer connected on one side to second side of said lower cladding layer;

a second conductive layer with asymmetrical energy bandgap to said first conductive lower cladding layer, connected on one side to second side of said active AlGaInP layer, serving as an upper cladding layer; and a second electrode connected on one side to second side of said upper cladding layer said a second side to said external power supply.

10. A light emitting diode as described in claim 9, wherein said DBR layer is made of alternate layers of different composition of $(Al_xGa_{1-x})_yIn_yP$, where $0 \leq x \leq 1$, $0 \leq y \leq 1$.

11. A light emitting diode as described in claim 9, wherein said DBR layer is made of alternate layers of different composition of $Al_xGa_{1-x}As$, where $0 \leq x \leq 1$.

12. A light emitting diode as described in claim 11, wherein a buffer layer is inserted between said active layer and said upper cladding layer.

13. A light emitting diode as described in claim 9, wherein said DBR is made of alternative layers of different composition of $(Al_xGa_{1-x})_yIn_{1-y}P$, where $0 \leq x \leq 1$, $0 \leq y \leq 1$, and $Al_xGa_{1-x}As$, where $0 \leq x1$.

14. A light emitting diode as described in claim 9, wherein a buffer layer is inserted between said active layer and said upper cladding layer.

15. A light-emitting diode, comprising:

a first electrode with one side connected to an external power supply;

a first conductive gallium-arsenide layer connected on one side to second side of said first electrode, serving as a substrate;

a distributed Bragg reflector (DBR) layer connected on one side to second side of said substrate, serving to reflect light;

a first conductive aluminum-gallium-indium phosphide (AlGaInP) layer connected to second side of said DBR layer, serving as a lower cladding layer;

an active AlGaInP layer connected on one side to second side of said lower cladding layer;

a second conductive layer with asymmetrical energy bandgap to said conductive lower cladding layer, connected on one side to second side of said active AlGaInP layer, serving as an upper cladding layer;

a transparent conductive thin oxide film connected on one side to second side of said upper cladding layer; and a second electrode connected on one side to second side of said transparent conductive thin oxide film and a second side to said external power supply.

* * * * *